United States Patent [19]
Nilarp

[11] Patent Number: 4,792,530
[45] Date of Patent: Dec. 20, 1988

[54] PROCESS FOR BALANCING FORWARD AND REVERSE CHARACTERISTIC OF THYRISTORS

[75] Inventor: Andres Nilarp, Rancho Palo Verdes, Calif.

[73] Assignee: International Rectifier Corporation, Los Angeles, Calif.

[21] Appl. No.: 32,483

[22] Filed: Mar. 30, 1987

[51] Int. Cl.$^4$ .................. H01L 21/26; H01L 29/74
[52] U.S. Cl. .......................... 437/6; 437/16; 437/17; 437/38; 437/902
[58] Field of Search ............... 437/6, 17, 16, 38, 902; 357/37, 38, 39

[56] References Cited

U.S. PATENT DOCUMENTS

| | | | |
|---|---|---|---|
| 3,809,582 | 5/1974 | Tarneja et al. | 437/17 |
| 3,840,887 | 10/1974 | Roberts et al. | 437/17 |
| 3,881,964 | 5/1975 | Cresswell et al. | 437/6 |

FOREIGN PATENT DOCUMENTS 3117202  11/1982  Fed. Rep. of Germany ........ 437/16

OTHER PUBLICATIONS

Fasce et al., "Effects of Electron Irradiation on High Power GTOB", Second International Conf. on Power Electronics and Variable Speed Drives, Nov. 1986, pp. 10–14.

Baliga et al., "Optimisation of Recombination Levels and Their Capture Cross Section in Power Rectifiers and Thyristors", Solid-State Electronics, vol. 20, Mar. 77, pp. 225–232.

Primary Examiner—Brian E. Hearn
Assistant Examiner—Tom Thomas
Attorney, Agent, or Firm—Ostrolenk, Faber, Gerb & Soffen

[57] ABSTRACT

A thyristor having a beveled edge extending from its top surface is irradiated by an electron beam which is applied only to the beveled surface and is also electron beam irradiated from its bottom surface through an expansion plate fixed to the bottom surface. The radiation dose applied to the beveled surface is from five to thirty times that applied to the full bottom surface. The electron beam irradiation of the bevel substantially reduces the lifetime of the material in the bevel area to enable balancing of forward and reverse leakage current characteristics and balancing of the forward and reverse voltage blocking characteristics of the device.

9 Claims, 1 Drawing Sheet

PROCESS FOR BALANCING FORWARD AND REVERSE CHARACTERISTIC OF THYRISTORS

BACKGROUND OF THE INVENTION

This invention relates to thyristors and more specifically relates to a novel process for balancing the forward and reverse characteristics of a thyristor.

Thyristors, sometimes called silicon controlled rectifiers or SCRs, are devices of well-known construction and characteristics. Very high voltage thyristors, for example those having a blocking voltage of 1,200 volts or greater, commonly have a bevel around their outer surface which enables junctions reaching the outer periphery of the chip to withstand the high blocking voltage by spreading out the electric field at the junction edge. Commonly, a double bevel is used so that the upper junction of the device has a smaller interior bevel angle than the lower junction. Commonly, the uppermost emitter junction is a planar junction terminating on the upper surface of the wafer in which the device is formed.

It is desirable that reverse blocking voltage be equal to the forward blocking voltage at room temperature, in such devices, and further that the reverse leakage current be as close as possible to the forward leakage current, at high temperatures. Commonly, however, the forward blocking voltage is less than the reverse blocking voltage and the forward leakage current is greater than the reverse leakage current. One reason for these differences is the difference in the alphas of the PNP transistor section and the NPN transistor section of the thyristor.

It is known that thyristor characteristics can be controlled by proton, alpha particle, or electron irradiation of the thyristor. The use of nuclear irradiation for reducing the switching time of a thyristor is disclosed in U.S. Pat. No. 4,056,408 to Bartko and Sun, issued Nov. 1, 1977. Bartko, however, does not disclose a process for modifying and balancing the forward and reverse blocking voltage and the forward and reverse leakage currents of a thyristor.

SUMMARY OF THE INVENTION

In accordance with the invention, a thyristor wafer is selectively irradiated whereby the bulk of the wafer is irradiated from the wafer back (that side of the wafer which has the greatest area) by a relatively low dose electron beam to decrease the reverse bulk leakage current. The wafer bevel surface is strongly irradiated from the wafer top side with an electron beam to kill lifetime in the region beneath the bevel, thereby substantially reducing forward leakage current to a level at which it is about equal to the reverse leakage current. In order to selectively irradiate only the bevel surface, the wafer is irradiated from and perpendicular to its top, with a lead shield placed over the internal area of the thyristor bounded by the internal diameter of the bevel.

The terms "top" and "bottom" or "front" and "rear" of the wafer are chosen for convenience of description and do not describe a special orientation for the wafer.

In a preferred embodiment of the invention, the bevel surface is subjected to an electron beam radiation dose which is five to thirty times greater than that which is received in the bulk of the material. This process first balances forward and reverse leakage current at high temperature. It also tends to balance forward and reverse blocking voltage at room temperature.

DESCRIPTION OF THE PREFERRED EMBODIMENTS

Figure 1:
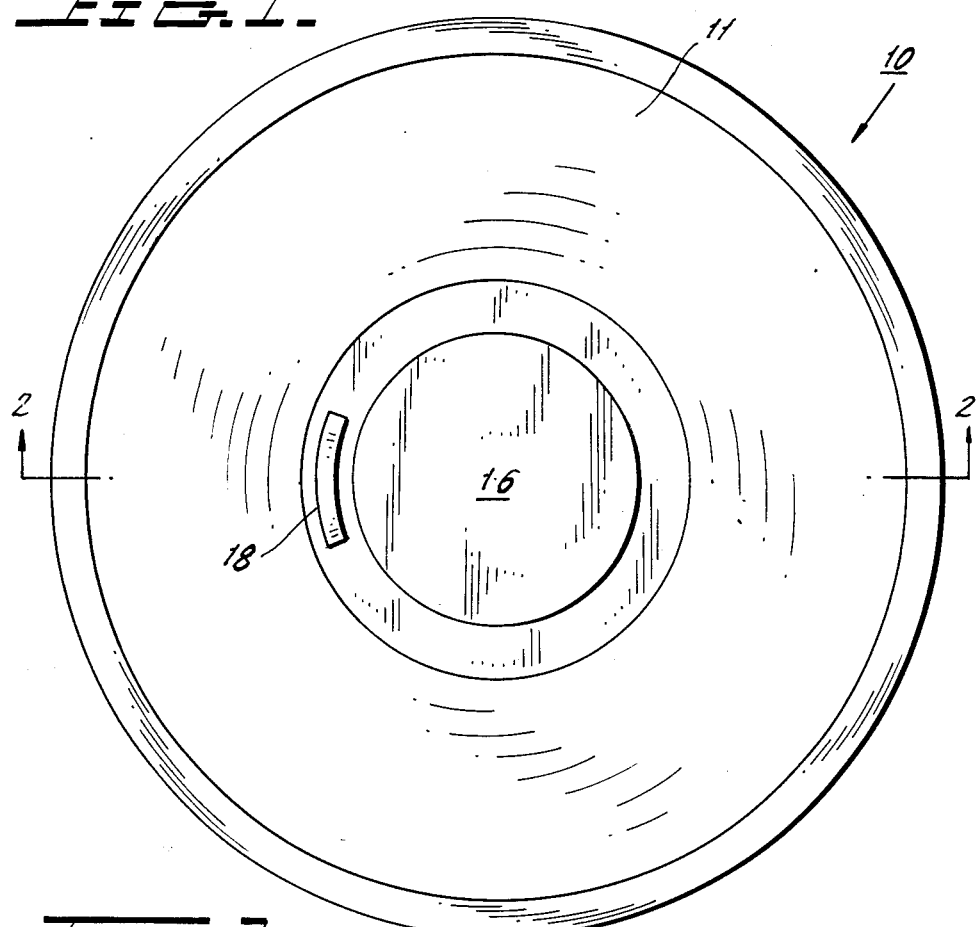
FIG. 1 is a top view of a typical thyristor which can be irradiated in accordance with the present invention.

Referring to the drawings, there is shown a wafer 10 which consists of a monocrystalline silicon wafer 11 which has been processed in the usual manner for thyristors. The wafer 11 has four alternate conductivity layers comprising the bottom P layer 12 followed by N layer 13, P layer 14 and N layer 15. The N layer 15, which is commonly termed the "emitter region" of the device, receives a cathode electrode 16 while the bottom of the wafer receives an anode electrode 17.

Figure 2:
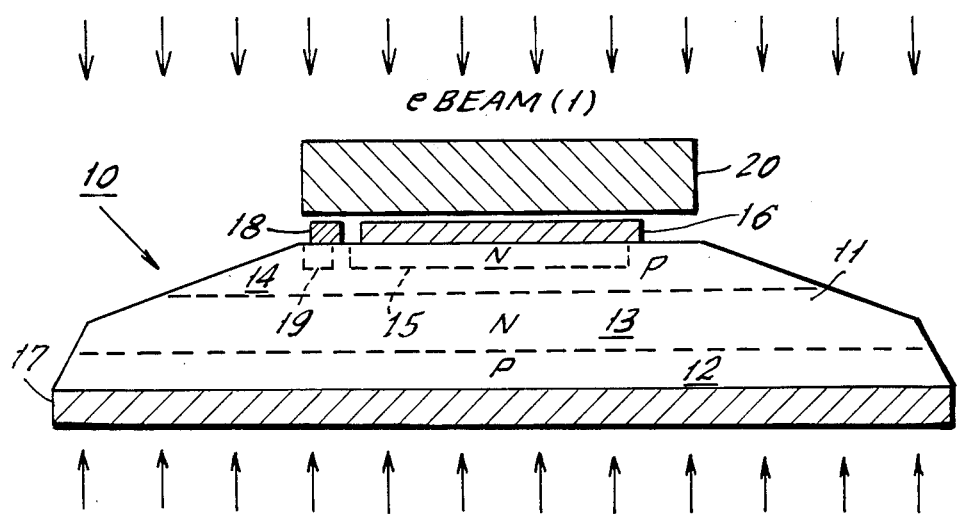
FIG. 2 is a cross-sectional view of FIG. 1 taken across the section line II—II showing a lead shield in place on the top surface to permit irradiation of the beveled surface only of the thyristor.

The device of FIG. 2 is shown with an accelerated gate-type structure and contains, at the top, an auxiliary cathode 18 which overlies an auxiliary N type emitter region 19. A gate (not shown) is conventionally spaced from emitter region 19.

The device of FIGS. 1 and 2 is a high voltage, high current device and has a voltage rating both forward and reverse of 1,200 volts or greater and a current carrying ability which may be greater than about ½ ampere when the device is turned on. The wafer is shown as a circular wafer and has a diameter, for example, of 12 to 77 millimeters. Larger diameters could also be employed for greater current capacity.

The wafer thickness for the silicon 11 is typically greater than about 0.8 mil. The device is processed as is well known to form the various junctions shown. Typically the process disclosed in U.S. Pat. No. 4,638,553 can be employed for the manufacture of the basic device.

Emitter electrodes 16 and 18 are relatively thin electrodes having a thickness, typically of about 6 microns. The lower electrode 17, however, is an expansion plate typically formed of molybdenum having a thickness of from about 50 to 125 mils.

The outer periphery of the wafer has a double bevel. The first angle, which is the positive bevel angle, is generally between 30° and 60° when measured from the bevelled surface to the plane of the bottom of the wafer. The second bevel, known as the negative bevel, forms an angle of from 1° to 10° when measured between the bevelled surface and the plane of the bottom surface of the wafer.

Thyristors of the type disclosed in FIGS. 1 and 2 are usually limited in their blocking voltage by the high temperature performance of the device. Thus, yield is limited in the manufacturing process if there is a high leakage current at high temperature. It is also desired in such thyristors that the forward leakage current be as closely matched to the reverse leakage current as possible and the forward blocking voltage be matched to the reverse blocking voltage at room temperature.

In accordance with the present invention, the lifetime of the silicon material in the volume having an upper boundary defined by the beveled surface is substantially reduced relative to the lifetime of the remaining interior bulk of the wafer. This reduces the alpha of the PNP transistor formed between regions 12, 13 and 14, relative to the alpha of the NPN transistor formed between regions 13, 14 and 15. It is also desired to reduce the lifetime of the bulk material containing the PNP transistor 12, 13, 14 in order to decrease reverse leakage current, but the lifetime of the bevel region is substantially decreased to more greatly reduce forward leakage current.

The differential change in lifetime between the interior bulk region and bevel region in the wafer 10 is obtained by irradiating the device shown in FIG. 2 from the bottom with a low dose electron beam radiation and from its top surface with a very high dose beam (5 to 30 times greater than the dose of lower beam 2). Conveniently, the bulk region of the device top surface is masked against electron beam radiation as by a lead mask 20. The lead mask 20 in FIG. 2 covers the full upper area of the wafer enclosed by the inner diameter of the wafer bevel and can, for example, have a thickness greater than one-quarter of an inch, and preferably about one-half to three-quarters of an inch.

The upper irradiating electron beam of FIG. 2 has an energy preferably of about 12 MEV and applies a total dose to the wafer of from 0.5 to 5 megarads, preferably 1.5 to 2.5 megarads. 2.2 megarads is the preferred dose. Electron beam 2 is directed perpendicular to the upper wafer surface.

A second electron beam, which is also perpendicular to the bottom surface, and irradiates the wafer 11 through the molybdenum expansion plate 11, is a 10 MEV beam which applies a total dose of about 0.04 to 0.01 megarads, depending on the thickness of the molybdenum.

As a result of the novel selective irradiation of the region in the bevel and the region in the bulk, it has been found that the forward and reverse leakage currents of the device at high temperature (above 80° C.) are equalized and that the forward and reverse breakdown voltages at room temperature are equalized. Moreover, it has been found that leakage current at high temperature does not icrease as rapidly as in devices which are not subject to the novel selected electron beam radiation of the present invention.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. The process of treating a thin, flat power thyristor wafer to balance the forward and reverse leakage currents at elevated temperature and to balance the forward and reverse blocking voltages at room temperature; said wafer having a large area bottom major surface, a small area top major surface, a beveled peripheral surface forming said major surfaces, and at least two planar junctions extending parallel to said top and bottom major surfaces; said process comprising the electron beam irradiation of said wafer through said bottom surface and from the bottom of said wafer with a first total radiation dose, and the electron beam irradiation of only the silicon lying below said peripheral surface through the top of said peripheral surface and from the top of said wafer with a second total radiation dose at least 5 times greater than said first dose.

2. The process of claim 1, which further includes the step of applying an electron beam opaque mask to said small area top major surface of said wafer before applying said second total dose to said wafer, whereby said second dose is applied only to the exposed said peripheral surface.

3. The process of claim 1, wherein an expansion plate of material having a similar thermal coefficient of expansion to that of silicon is bonded to said bottom surface, and wherein said first radiation dose is applied through said expansion plate.

4. The process of claim 2, wherein an expansion plate of material having a similar thermal coefficient of expansion to that of silicon is bonded to said bottom surface, and wherein said first radiation dose is applied through said expansion plate.

5. The process of claim 2, wherein said first radiation dose is from about 0.5 to about 5 megarads and wherein said second radiation dose is from about 0.04 to about 0.1 megarads.

6. The process of claim 5, wherein said first radiation dose is at an energy of about 12 MEV and wherein said second radiation dose is at an energy of about 10 MEV.

7. The process of claim 6, wherein an expansion plate of material having a similar thermal coefficient of expansion to that of silicon is bonded to said bottom surface, and wherein said first radiation dose is applied through said expansion plate.

8. The process of claim 1, wherein said first radiation dose is from about 0.5 to about 5 megarads and wherein said second radiation dose is from about 0.04 to about 0.1 megarads.

9. The process of claim 8, wherein said first radiation dose is at an energy of about 12 MEV and wherein said second radiation dose is at an energy of about 10 MEV.

* * * * *